United States Patent [19]

Mellink et al.

[11] Patent Number: 5,013,384
[45] Date of Patent: May 7, 1991

[54] VACUUM SYSTEM

[75] Inventors: Willem F. Mellink, Eindhoven; Peter J. G. M. Janssen, Nijmegen; Jan Zwier, Eindhoven; Harm Lotterman, Nijmegen, all of Netherlands

[73] Assignee: U.S. Philips Corporation, New York, N.Y.

[21] Appl. No.: 542,454

[22] Filed: Jun. 22, 1990

[30] Foreign Application Priority Data

Jun. 28, 1989 [NL] Netherlands ............................ 8901630

[51] Int. Cl.$^5$ .......................... B65G 1/00; C23C 14/00; C03C 15/00
[52] U.S. Cl. ..................................... 156/345; 118/50; 414/217
[58] Field of Search ....................... 156/643, 646, 345; 118/712, 715, 50; 204/298; 414/217; 141/8, 65, 66

[56] References Cited

U.S. PATENT DOCUMENTS 4,622,918 11/1986 Bok ........................................ 118/718
4,687,542 8/1987 Davis et al. ........................... 156/643
4,718,957 1/1988 Sensenbrenner ..................... 156/152

OTHER PUBLICATIONS

"Vacuum Exhausting Method", Japan (Abstract) 59-114814(A), by Nagashima-1984.
"Vacuum Exhaust Leak Device", Japan (Abstract) 61-58252(A), by Otaka-1986.

Primary Examiner—William A. Powell
Attorney, Agent, or Firm—William Squire

[57] ABSTRACT

An inlet opening in an evacuatable vacuum system is substantially enlarged and closed off by a porous plate so that the ingress of dust is avoided and a very uniform inflow of gas is realized. A similar plate can be used for closing off a gas outlet opening of the vacuum chamber.

12 Claims, 1 Drawing Sheet

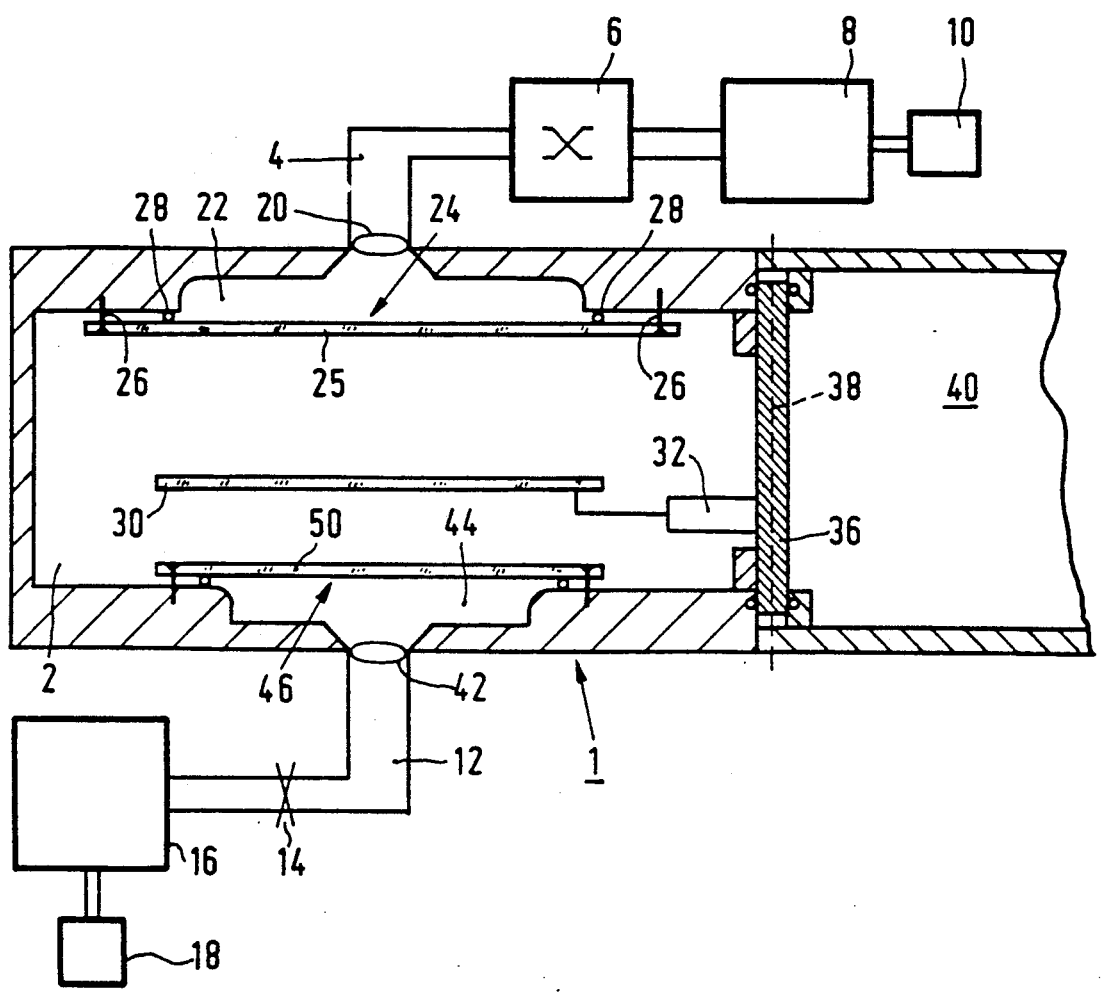

VACUUM SYSTEM

BACKGROUND OF THE INVENTION

1. Field of the Invention

The invention relates to a vacuum system which comprises an evacuatable chamber, including a gas inlet and a gas outlet, for storage, measurement or treatment of objects sensitive to dust contamination.

2. Description of the Prior Art

Various means are known for realising a vacuum clean room for performing measurements on, the pre-processing or the processing, or the temporary storage of objects sensitive to dust contamination during a processing cycle.

U.S. Pat. No. 4,718,975 describes a processing chamber in which an object to be processed, that is to say a semiconductor wafer, is covered by a displaceable cover plate during the non-processing phases.

U.S. Pat. No. 4,687,542 describes a system for the intermediate storage of wafers where a number of wafers is arranged, accommodated in a sealed box, in a space to be evacuated, the box being opened only when the space has been sealed and evacuated.

JP-A 59-114814 describes a vacuum system in which a prevacuum pumping valve comprises a porous material which acts as a choke valve.

JP-A 61-58252 describes a specimen chamber in which the gas flow is always directed downwards during filling or evacuation of the space in order to achieve dust reduction. The aim is to prevent the stirring up of dust particles.

Even though all these means lead to a given improvement in view of dust contamination, it has been found that they are not adequate for many applications.

SUMMARY OF THE INVENTION

It is the object of the invention to mitigate these drawbacks; to achieve this, a vacuum system of the kind set forth in accordance with the invention is characterized in that a gas inlet comprises an intermediate chamber which is connected via a porous plate to the vacuum chamber through a passage surface which is comparatively large with respect to a gas inlet cross-sectional surface.

Because the porous material in a vacuum system in accordance with the invention closes off a comparatively large passage, it can readily combine the functions of choke valve, spatially homogenizing gas inlet, and readily exchangeable and possibly refreshable dust filter.

In a preferred embodiment a porous plate is arranged between a widened portion of an inlet opening and the vacuum chamber. The active surface of the plate is preferably as large as possible, specifically up to at least 10 times larger than the passage surface area of the outlet opening. Such a plate is formed, for example by a porous stainless steel plate mounted between the inlet opening and the vacuum chamber by way of a simple, detachable clamping device.

In a further preferred embodiment, a gas evacuation opening is also provided with such a porous plate.

A vacuum chamber in accordance with the invention, closed off by a porous plate, may form part of, for example a chip manufacturing apparatus such as an electron beam pattern generator, of a chip testing instrument, for example in the form of a suitably constructed scanning electron microscope, an ion implantation apparatus, an apparatus for the physical-chemical processing of, for example integrated circuit elements, photodiodes and the like. The vacuum space therein may act as a measurement space or processing space, but also as a vacuum load lock for the temporary storage of, for example wafers or chips during a processing or measurement process. For the sake of clarity it is to be noted that the term "vacuum chamber" is to be understood to mean herein a space which is to be conditioned as regards pressure and that the term vacuum does not indicate a degree of underpressure.

IN THE DRAWING

Some preferred embodiments in accordance with the invention will be described in detail hereinafter with reference to the sole figure of the drawing comprising a sectional elevation view of a system in accordance with an embodiment of the present invention.

DESCRIPTION OF THE PREFERRED EMBODIMENT

The vacuum system 1 comprises a vacuum chamber 2 having a gas inlet 4 with a point-of-use filter 6, a pump 8 and a drive motor 10. At an opposite side of the inlet there is situated a gas outlet 12 with a valve 14, a pump 16 and a drive motor 18. A gas inlet opening 20 communicates with an enlarged intermediate chamber 22 which communicates with the actual vacuum chamber 2 via a passage opening 24 which is large in area in comparison with the area of the inlet opening 20. The passage opening 24 is closed by a porous plate 25 which is preferably made of, for example sintered stainless steel. The porous plate 25 is in this case mounted over the passage opening 14 by means of a comparatively readily detachable clamping device 26 with O-rings 28. An object 30 which is sensitive to contamination by dust and which is to be treated or measured is present in the vacuum chamber 2; this object is, for example a semiconductor element such as a semiconductor wafer, a matrix of semiconductor elements and the like. The plate 25 has an active surface area of about 2 to 10 times the cross-sectional area of the outlet 12.

An object of this kind may be supported by a diagrammatically indicated supporting device 32 which may also comprise a measurement device for position determination, temperature measurement, current dissipation etc.; in this case the device is connected to a wall portion 36 which is rotatable about an axis 38, so that the object can be displaced between a conditioning room 40 and the vacuum chamber.

In the present embodiment the gas outlet 12 is connected to the vacuum chamber via a pump-down opening 42, a pump-down chamber 44 and an outlet passage opening 46. The outlet passage opening can also be closed off by means of a porous plate 50. The chamber 44 and opening 46 are larger in area than opening 42.

The chamber 2 may be used, for example, in an apparatus for integrated circuit chip inspection, ion implantation or for a scanning electron microscope.

What is claimed is:

1. A vacuum system for the storage, measurement or treatment of objects sensitive to dust contamination comprising:
   a housing forming an evacuatable chamber, said chamber having a gas inlet and a gas outlet, said inlet and outlet each having a corresponding given cross-sectional area;

means for forming an intermediate chamber between said inlet and said chamber; and a porous filter plate between said intermediate chamber and said evacuatable chamber, said plate having a gas passage surface area relatively large with respect to said inlet cross-sectional area.

2. A vacuum system as claimed in claim 1, characterized in that an active passage surface area of the porous plate amounts to at least from approximately 2 to 10 times the cross-sectional area of the outlet opening.

3. The system of claim 1 wherein said intermediate chamber is a widened portion of said inlet.

4. The system of claim 1 including detachable clamping means for securing the porous plate to said housing.

5. The system of claim 3 further including a second porous plate between the outlet and said evacuatable chamber.

6. The system of claim 5 wherein said housing has a second intermediate chamber between said evacuatable chamber and said outlet, said second chamber being an enlarged portion of said outlet, said second plate being between the second chamber and said evacuatable chamber.

7. A vacuum system as claimed in claim 6, characterized in that it forms part of a chip inspection apparatus.

8. A vacuum system as claimed in claim 6, characterized in that it forms part of an ion implantation apparatus.

9. A vacuum system as claimed in claim 6, characterized in that it forms part of a scanning electron microscope.

10. A vacuum system as claimed in claim 6, characterized in that it forms part of an apparatus for the manufacture or inspection of objects sensitive to dust contamination.

11. The system of claim 6 including means secured to the housing for receiving at least one semiconductor for processing in said evacuated chamber.

12. The system of claim 1 including means secured to the housing for receiving at least one semiconductor element for processing in said evacuated chamber.

* * * * *